United States Patent
Yoshida et al.

(10) Patent No.: US 11,805,698 B2
(45) Date of Patent: Oct. 31, 2023

(54) POWER GENERATION ELEMENT AND POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Hisashi Yoshida, Kawasaki Kanagawa (JP); Hisao Miyazaki, Yokohama Kanagawa (JP); Shigeya Kimura, Yokohama Kanagawa (JP); Hiroshi Tomita, Yokohama Kanagawa (JP); Souichi Ueno, Ota Tokyo (JP); Takeshi Hoshi, Yokohama Kanagawa (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 17/404,933

(22) Filed: Aug. 17, 2021

(65) Prior Publication Data

US 2022/0149257 A1    May 12, 2022

(30) Foreign Application Priority Data

Nov. 9, 2020   (JP) .................................. 2020-186473

(51) Int. Cl.
*H10N 10/81* (2023.01)
*H10N 10/852* (2023.01)
*H10N 10/855* (2023.01)

(52) U.S. Cl.
CPC ........... *H10N 10/81* (2023.02); *H10N 10/852* (2023.02); *H10N 10/855* (2023.02)

(58) Field of Classification Search
CPC ......... H01L 35/04; H01L 35/16; H01L 35/22; H10N 10/81; H10N 10/852; H10N 10/855
See application file for complete search history.

(56) References Cited

U.S. PATENT DOCUMENTS 5,712,448 A * 1/1998 Vandersande ........... H01L 35/32
136/238
2003/0160251 A1 * 8/2003 Wanlass .............. H01L 31/0504
257/82

(Continued)

FOREIGN PATENT DOCUMENTS

| JP | S46-43422 A | 12/1971 |
| JP | 2009-535840 A | 10/2009 |

(Continued)

*Primary Examiner* — Tamir Ayad
(74) *Attorney, Agent, or Firm* — Finnegan, Henderson, Farabow, Garrett & Dunner, LLP

(57) ABSTRACT

According to one embodiment, a power generation element, includes a first conductive layer, a second conductive layer, and a crystal member. A direction from the second conductive layer toward the first conductive layer is along a first direction. The crystal member is provided between the first conductive layer and the second conductive member. The crystal member includes a crystal pair. The crystal pair includes a first crystal part and a second crystal part. A second direction from the first crystal part toward the second crystal part crosses the first direction. A gap is provided between the first crystal part and the second crystal part. The first conductive layer is electrically connected to the first crystal part. The second conductive layer is electrically connected to the second crystal part.

19 Claims, 17 Drawing Sheets

(56) References Cited

U.S. PATENT DOCUMENTS

| | | | |
|---|---|---|---|
| 2007/0034245 A1* | 2/2007 | Nakajima | B22F 9/08 |
| | | | 136/201 |
| 2007/0289315 A1 | 12/2007 | Larsson | |
| 2011/0114146 A1* | 5/2011 | Scullin | H10N 19/00 |
| | | | 438/54 |
| 2012/0299438 A1 | 11/2012 | Kimura et al. | |
| 2018/0337317 A1 | 11/2018 | Kimura et al. | |
| 2020/0028365 A1 | 1/2020 | Yoshida et al. | |

FOREIGN PATENT DOCUMENTS

| | | |
|---|---|---|
| JP | 2012-248618 A | 12/2012 |
| JP | 2018-195790 A | 12/2018 |
| JP | 2020-13886 A | 1/2020 |

* cited by examiner

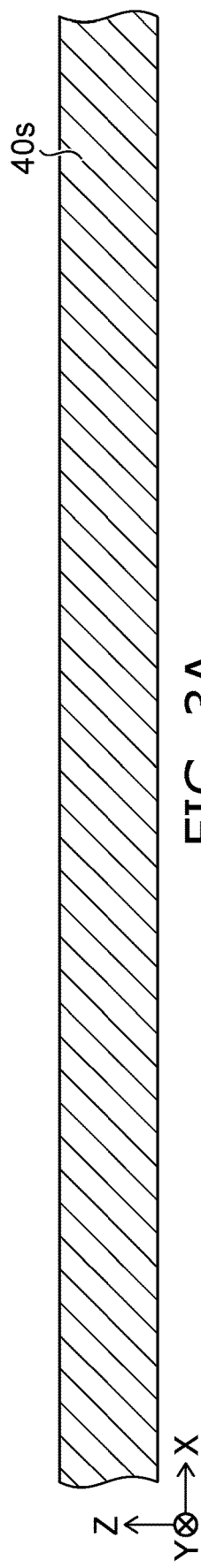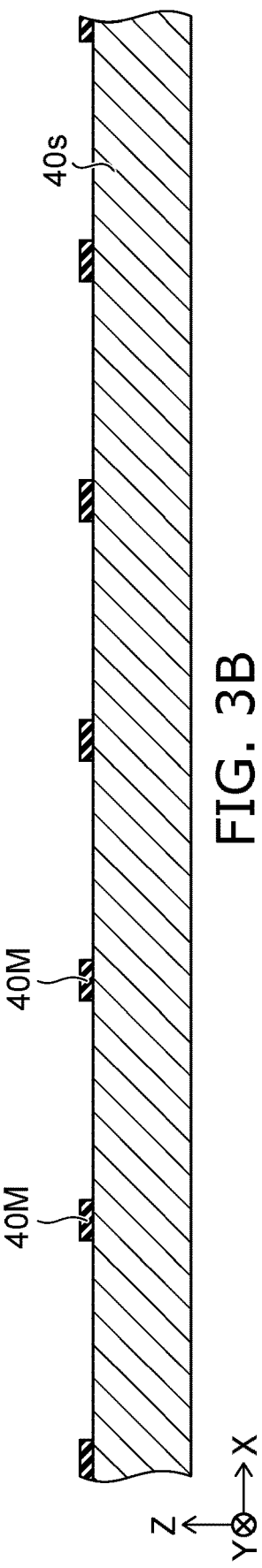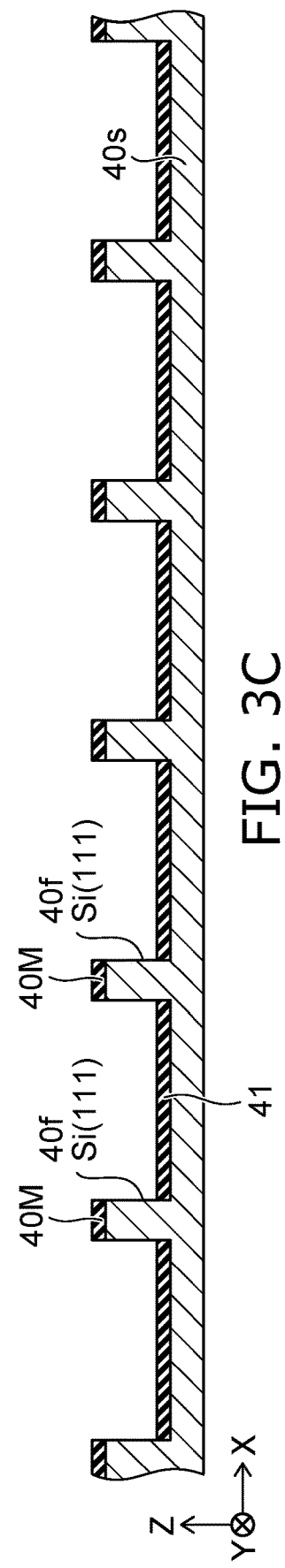

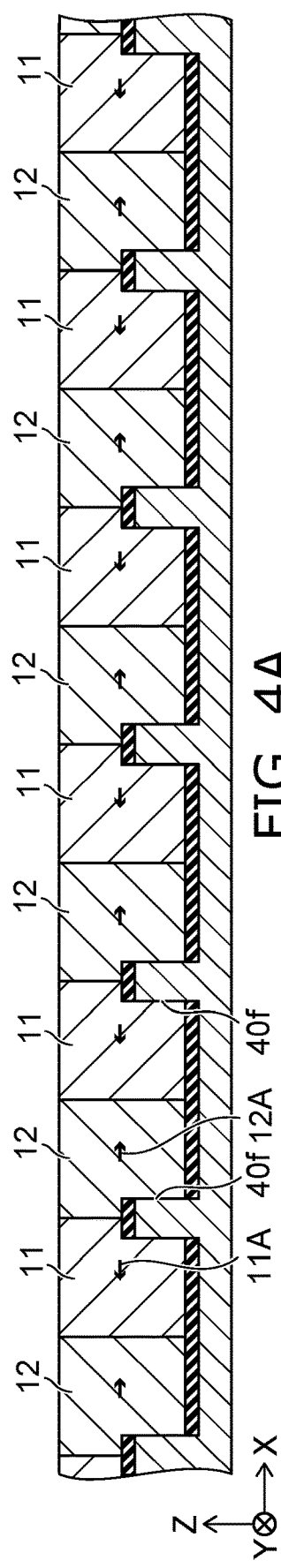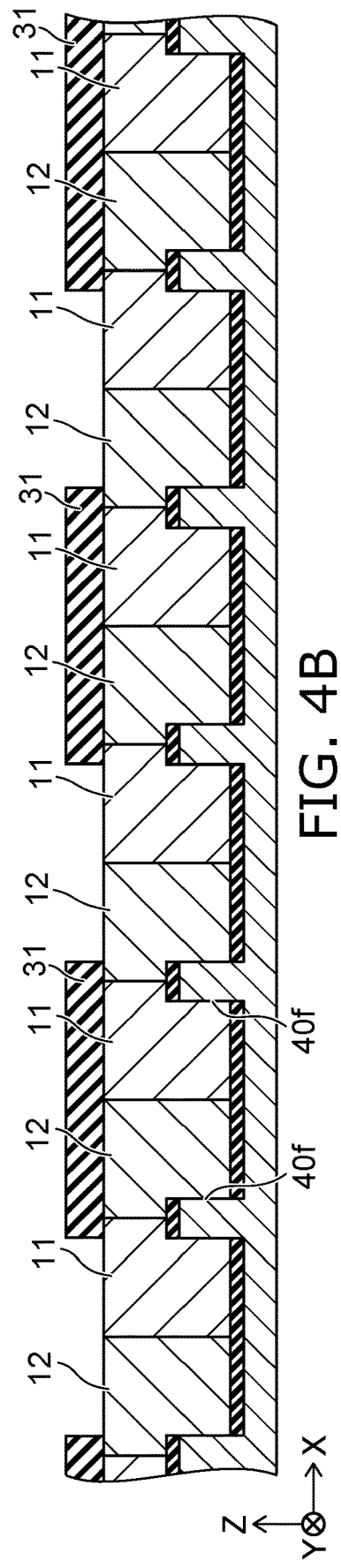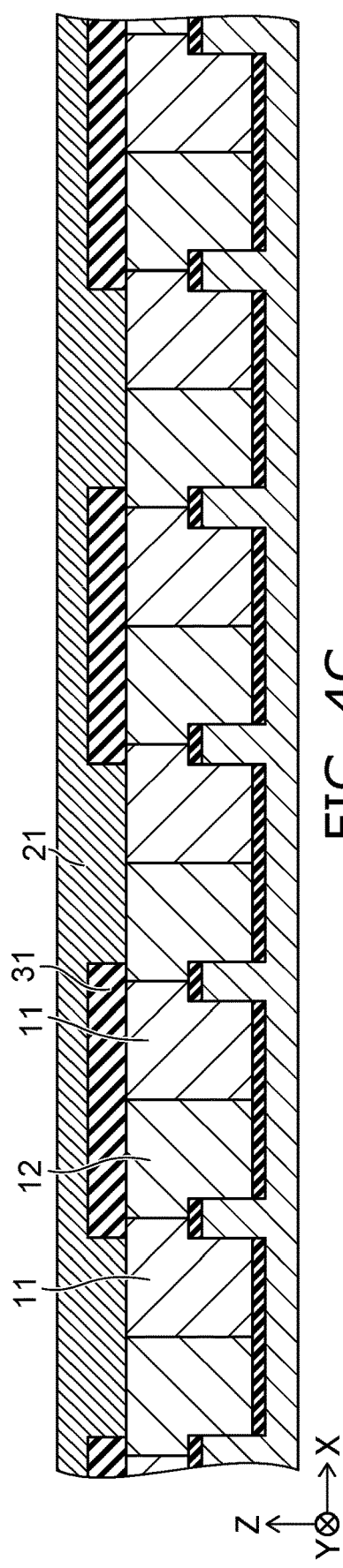

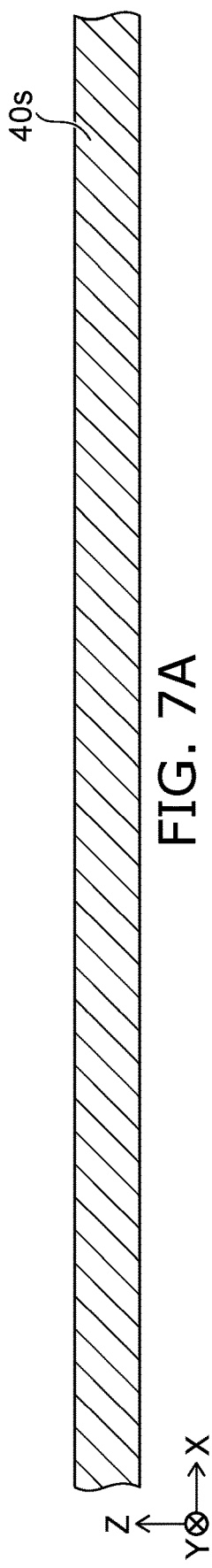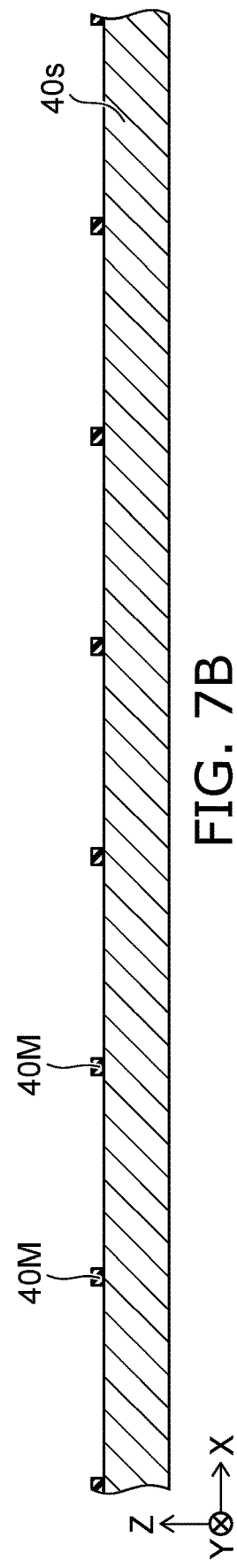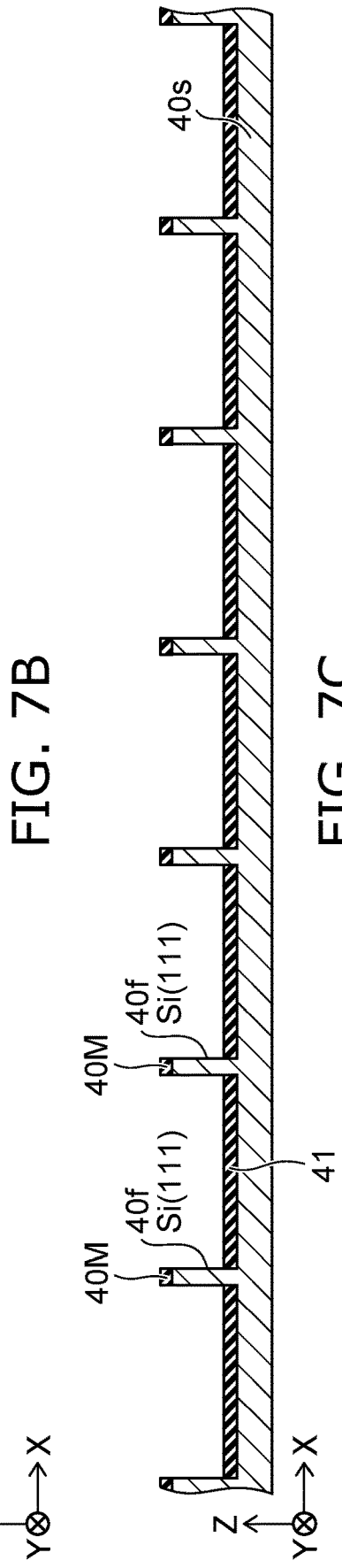

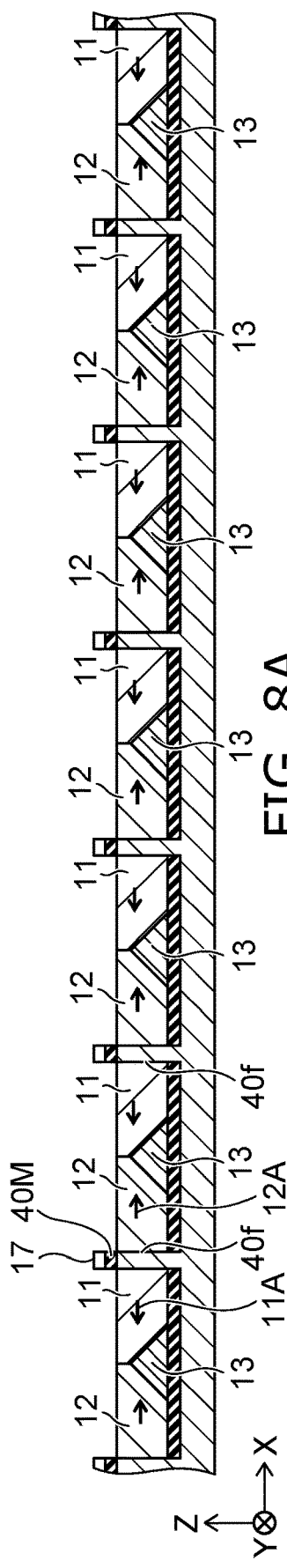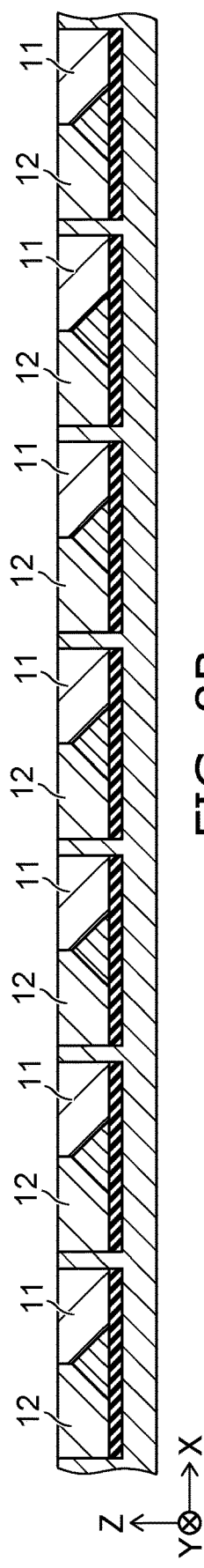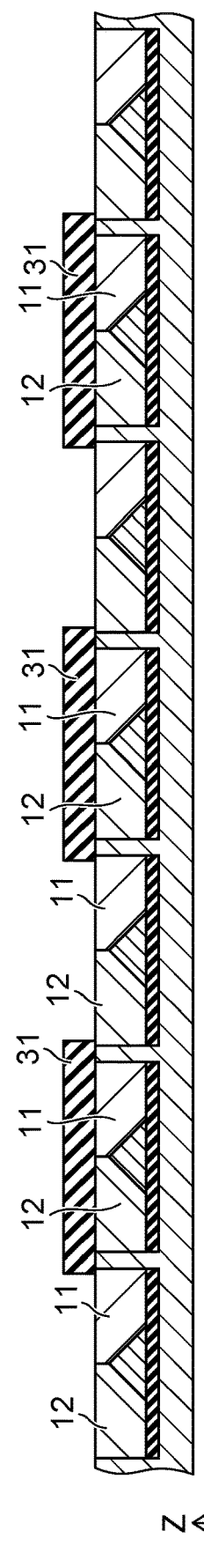

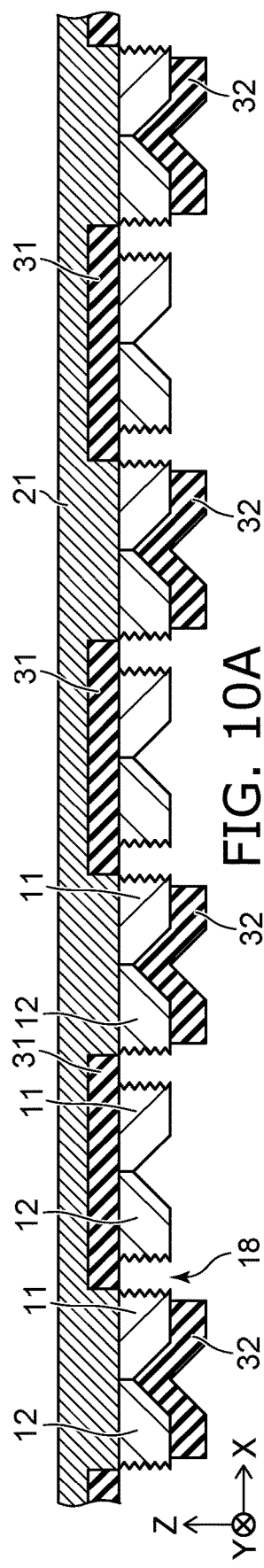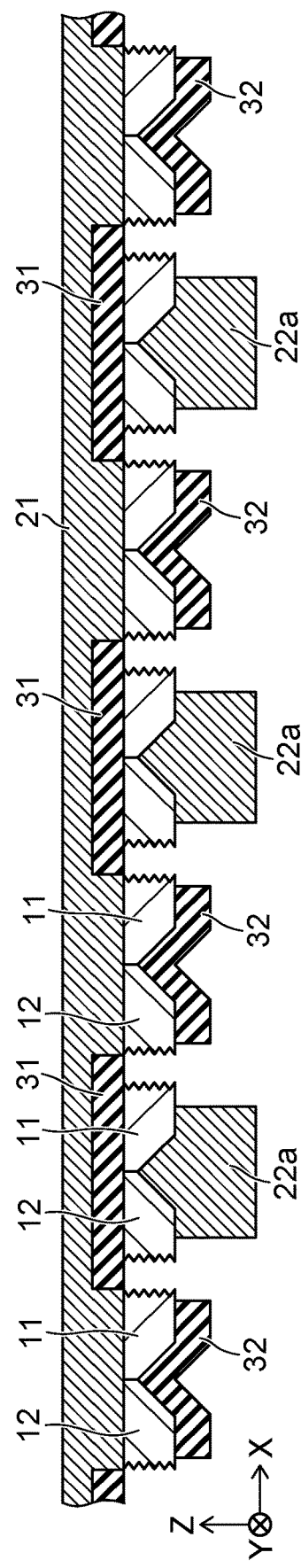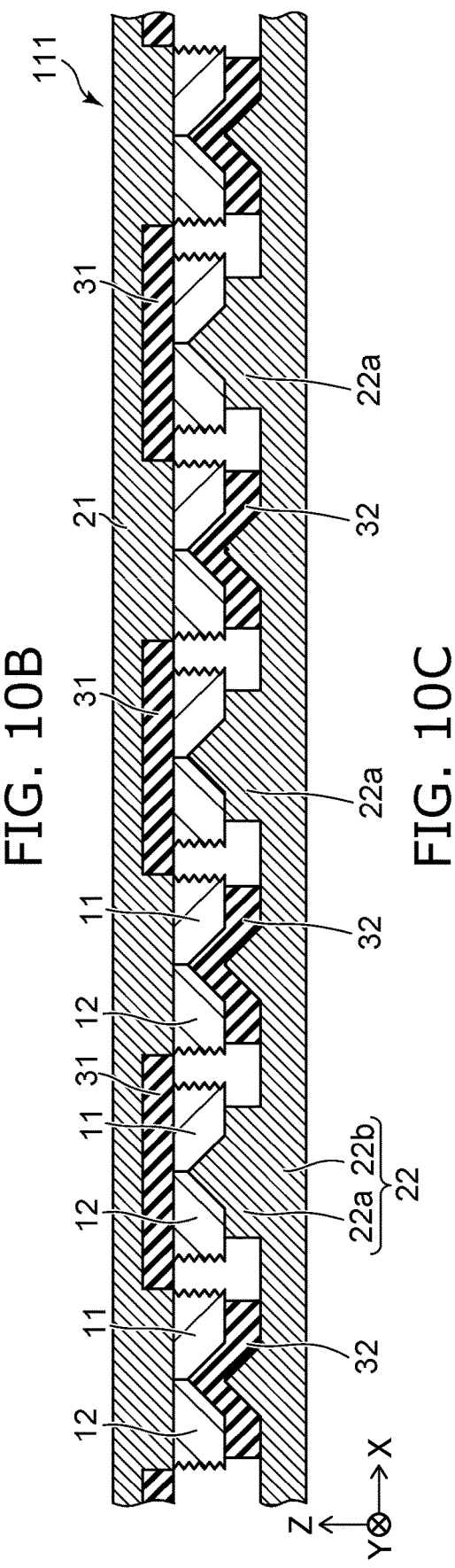

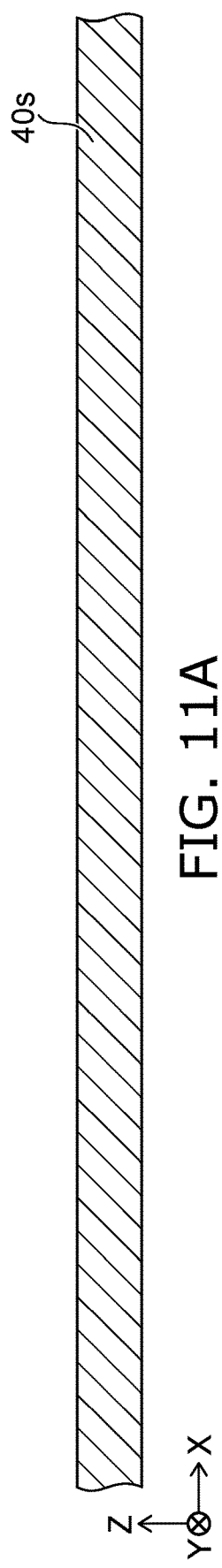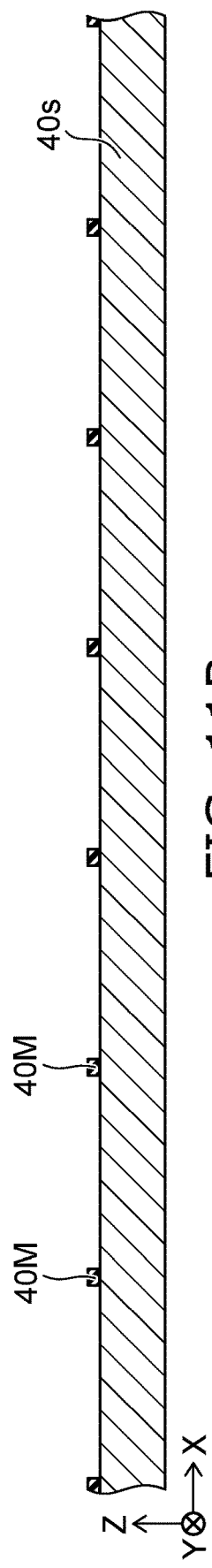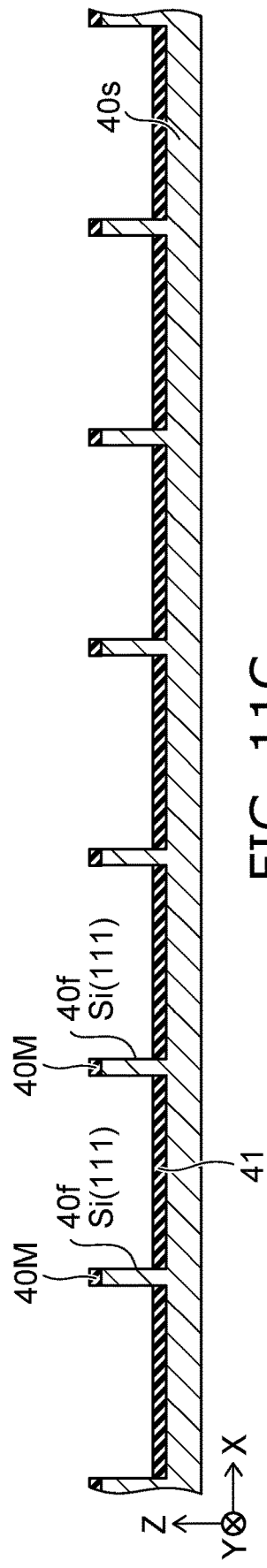

POWER GENERATION ELEMENT AND POWER GENERATION SYSTEM

CROSS-REFERENCE TO RELATED APPLICATIONS

This application is based upon and claims the benefit of priority from Japanese Patent Application No. 2020-186473, filed on Nov. 9, 2020; the entire contents of which are incorporated herein by reference.

FIELD

Embodiments described herein relate generally to a power generation element and a power generation system.

BACKGROUND

For example, there is a power generation element such as a thermionic element. It is desired to improve the efficiency of the power generation element.

BRIEF DESCRIPTION OF THE DRAWINGS

FIGS. 3A to 3C are schematic cross-sectional views in process order illustrating a method for manufacturing the power generation element according to the first embodiment;

FIGS. 4A to 4C are schematic cross-sectional views in process order illustrating a method for manufacturing the power generation element according to the first embodiment;

FIGS. 7A to 7C are schematic cross-sectional views in process order illustrating a method for manufacturing a power generation element according to the first embodiment;

FIGS. 8A to 8C are schematic cross-sectional views in process order illustrating a method for manufacturing the power generation element according to the first embodiment;

FIGS. 10A to 10C are schematic cross-sectional views in process order illustrating a method for manufacturing the power generation element according to the first embodiment;

FIGS. 11A to 11C are schematic cross-sectional views in process order illustrating a method for manufacturing a power generation element according to the first embodiment;

DETAILED DESCRIPTION

Figure 1A:
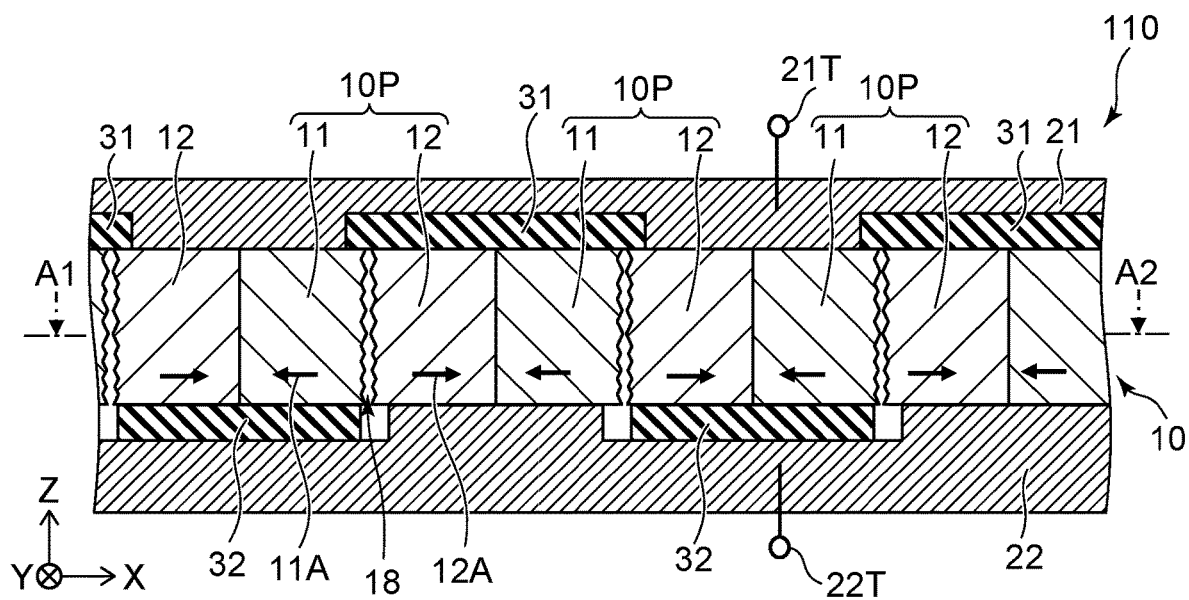
FIGS. 1A and 1B are schematic cross-sectional views illustrating a power generation element according to a first embodiment.

According to one embodiment, a power generation element includes a first conductive layer, a second conductive layer, and a crystal member. A direction from the second conductive layer toward the first conductive layer is along a first direction. The crystal member is provided between the first conductive layer and the second conductive layer. The crystal member includes a crystal pair. The crystal pair includes a first crystal part and a second crystal part. A second direction from the first crystal part toward the second crystal part crosses the first direction. A gap is provided between the first crystal part and the second crystal part. The first conductive layer is electrically connected to the first crystal part. The second conductive layer is electrically connected to the second crystal part.

According to one embodiment, a power generation system includes the power generation described above.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
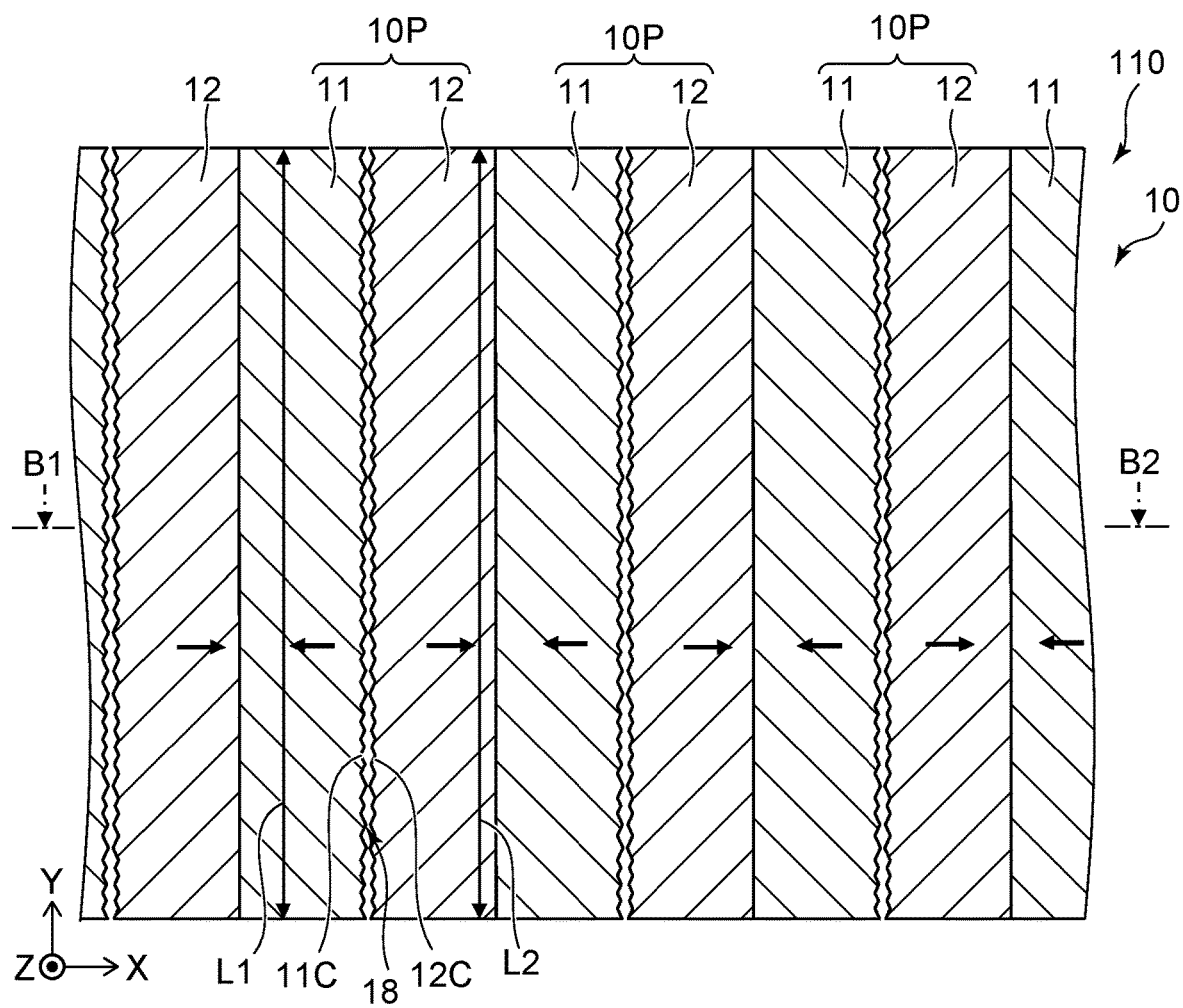

FIGS. 1A and 1B are schematic cross-sectional views illustrating a power generation element according to a first embodiment.

FIG. 1B is a sectional view taken along line A1-A2 of FIG. 1A. FIG. 1A is a sectional view taken along line B1-B2 of FIG. 1B.

As shown in FIGS. 1A and 1B, a power generation element 110 according to the embodiment includes a first conductive layer 21, a second conductive layer 22, and a crystal member 10.

The direction from the second conductive layer 22 toward the first conductive layer 21 is along a first direction. The first direction is taken as a Z-axis direction. One direction perpendicular to the Z-axis direction is taken as an X-axis direction. The direction perpendicular to the Z-axis direction and the X-axis direction is taken as a Y-axis direction.

The first conductive layer 21 and the second conductive layer 22 extend along an X-Y plane, for example.

The crystal member 10 is provided between the first conductive layer 21 and the second conductive layer 22. The crystal member 10 includes a crystal pair 10P. The crystal pair 10P includes a first crystal part 11 and a second crystal part 12. A second direction from the first crystal part 11 toward the second crystal part 12 crosses the first direction. The second direction is, for example, the X-axis direction. A gap 18 is provided between the first crystal part 11 and the second crystal part 12. For example, the pressure in the gap 18 is lower than 1 atmosphere. The gap 18 is, for example, in a reduced pressure state.

In this example, the crystal member 10 includes multiple crystal pairs 10P. The multiple crystal pairs 10P are arranged along the second direction (for example, the X-axis direction).

For example, one second crystal part 12 of the multiple crystal pairs 10P is between one first crystal part 11 of the multiple crystal pairs 10P and another first crystal part 11 of the multiple crystal pairs 10P. There is a gap 18 between the one second crystal part 12 of the multiple crystal pairs 10P and the first crystal part 11 of the multiple crystal pairs 10P. For example, at least a portion of the one second crystal part 12 of the multiple crystal pairs 10P is in contact with at least a portion of the other one first crystal part 11 of the multiple crystal pairs 10P.

One first crystal part 11, one second crystal part 12, and the gap 18 between them form one crystal pair 10P.

The first conductive layer 21 is electrically connected to the one first crystal part 11 of the multiple crystal pairs 10P. The second conductive layer 22 is electrically connected to the one second crystal part 12 of the multiple crystal pairs 10P. The other first crystal part 11 of the multiple crystal pairs 10P is electrically connected to the second conductive layer 22. Another second crystal part 12 of the multiple crystal pairs 10P is electrically connected to the first conductive layer 21.

For example, when the temperature of the first conductive layer 21 is higher than the temperature of the second conductive layer 22, electrons are emitted from the first crystal part 11 toward the second crystal part 12. The electrons pass through the gap 18 and reach the second crystal part 12. When the temperature of the second conductive layer 22 is higher than the temperature of the first conductive layer 21, electrons are emitted from the second crystal part 12 toward the first crystal part 11. The electrons pass through the gap 18 and reach the first crystal part 11.

For example, a first terminal 21T electrically connected to the first conductive layer 21 and a second terminal 22T electrically connected to the second conductive layer 22 may be provided. The current associated with the electrons is drawn through these terminals. Electric current can be used as electric power. In the power generation element 110, the electrons are, for example, thermions.

Power generation is performed in a region where the first crystal part 11 and the second crystal part 12 face each other. In the embodiment, the direction in which the first crystal part 11 and the second crystal part 12 face each other crosses the stacking direction of the first conductive layer 21 and the second conductive layer 21. As a result, a density of the regions where the first crystal part 11 and the second crystal part 12 face each other can be increased. As a result, the amount of power generation per volume (or area) can be increased. In the embodiment, a power generation element which is possible to improve efficiency can be provided.

Figure 2A:
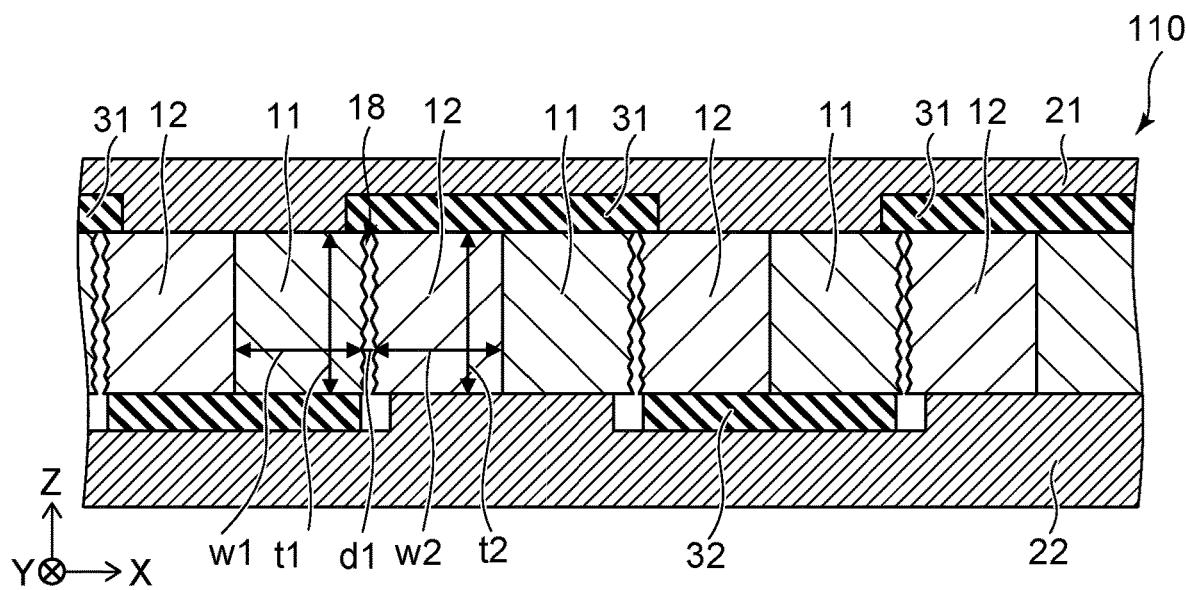
FIGS. 2A and 2B are schematic cross-sectional views illustrating the power generation element according to the first embodiment.
Figure 2B:
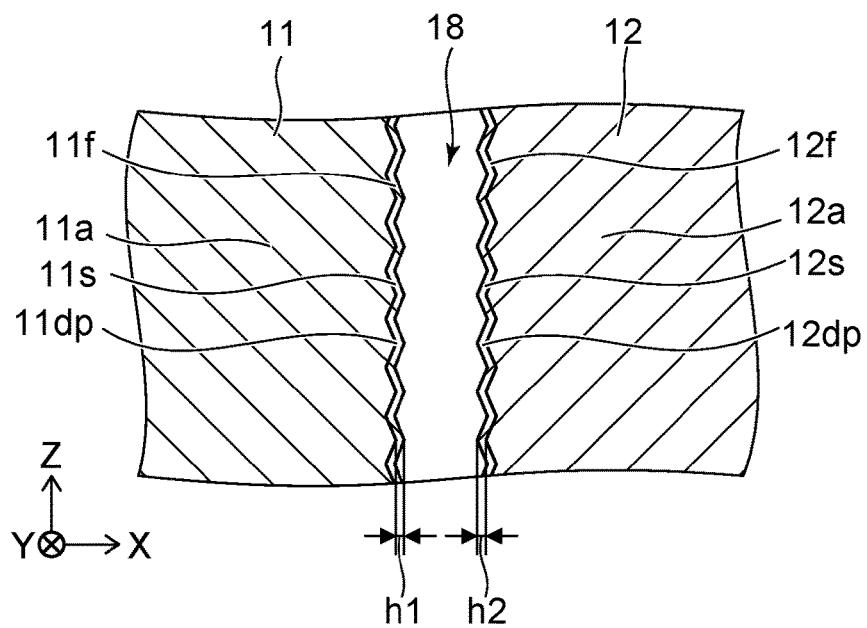

FIGS. 2A and 2B are schematic cross-sectional views illustrating the power generation element according to the first embodiment.

FIG. 2B is an enlarged view of a portion of FIG. 2A.

As shown in FIG. 2A, the first crystal part 11 has a first thickness t1 along the first direction (Z-axis direction) and a first width w1 along the second direction (for example, the X-axis direction). The first thickness t1 is larger than the first width w1. The second crystal part 12 has a second thickness t2 along the first direction and a second width w2 along the second direction. The second thickness t2 is larger than the second width w2. Since the first thickness t1 and the second thickness t2 are large, the region where the first crystal part 11 and the second crystal part 12 face each other can be increased. High efficiency can be easily obtained.

As shown in FIG. 1B, the first crystal part 11 has a first length L1 along a third direction. The third direction crosses the plane including the first and second directions. The third direction is, for example, the Y-axis direction. The first length L1 is larger than the first thickness t1. The second crystal part 12 has a second length L2 along the third direction. The second length L2 is larger than the second thickness t1. The first crystal part 11 and the second crystal part 12 have a band shape along the Y-axis direction. Since the first length L1 and the second length L2 are long, the region where the first crystal part 11 and the second crystal part 12 face each other can be increased. High efficiency can be easily obtained.

As shown in FIG. 2A, the gap 18 has a length d1 along the second direction (for example, the X-axis direction). The length d1 corresponds to the gap length. In one example, the length d1 is smaller than the first width w1 and smaller than the second width w2. Since the length d1 is short, electrons can efficiently pass through the gap 18. High efficiency is easy to obtain.

For example, the length d1 along the second direction of the gap 18 is not more than 10 µm. For example, the length d1 may be not more than 5 µm.

As shown in FIG. 2B, the first crystal part 11 includes a first surface 11f facing the second crystal part 12. The first surface 11f may include unevenness 11dp. A height h1 along the second direction (for example, the X-axis direction) of the unevenness 11dp is, for example, not less than 0.01 µm and not more than 10 µm.

As shown in FIG. 2B, the second crystal part 12 includes a second surface 12f facing the first crystal part 11. The second surface 12f may include unevenness 12dp. A height h2 along the second direction (for example, the X-axis direction) of the unevenness 12dp is, for example, not less than 0.01 µm and not more than 10 µm.

In a case where the first surface 11f and the second surface 12f are provided with unevenness, the length d1 along the second direction of the gap 18 may be practically as the average of the distances along the second direction between the first surface 11f and the second surface 12f.

As shown in FIG. 2B, the first crystal part 11 may include a first portion 11a and a first surface layer 11s. The first surface layer 11s is provided on the surface of the first portion 11a. For example, the first surface layer 11s is between the first portion 11a and the second crystal part 12. The first portion 11a is a crystal portion. The first portion 11a includes, for example, a nitride semiconductor and the like.

The first surface layer 11s includes, for example, at least one selected from the group consisting of Li, Na, K, Rb, Cs, Fr, Be, Mg, Ca, Sr, Ba and Ra. The first surface layer 11s includes, for example, an adsorbent including at least one selected from the group consisting of Li, Na, K, Rb, Cs, Fr, Be, Mg, Ca, Sr, Ba and Ra. As the first surface layer 11s, for example, Cs may be adsorbed on the surface of the first portion 11a.

As shown in FIG. 2B, the second crystal part 12 may include a second portion 12a and a second surface layer 12s. The first surface layer 12s is provided on the surface of the second portion 12a. For example, the second surface layer 12s is between the second portion 12a and the first crystal part 11. The second portion 12a is a crystal portion. The second portion 12a includes, for example, a nitride semiconductor and the like. The second surface layer 12s includes, for example, at least one selected from the group consisting of Li, Na, K, Rb, Cs, Fr, Be, Mg, Ca, Sr, Ba and Ra. The second surface layer 12s includes, for example, an adsorbent including at least one selected from the group consisting of Li, Na, K, Rb, Cs, Fr, Be, Mg, Ca, Sr, Ba and Ra. As the second surface layer 12s, for example, Cs may be adsorbed on the surface of the second portion 12a. By providing such a surface layer, for example, the electron emission efficiency is improved.

As shown in FIG. 1A, in this example, the power generation element 110 includes a first insulating member 31 and a second insulating member 32. The first insulating member 31 is provided between the second crystal part 12 and at least a portion of the first conductive layer 21. The second insulating member 32 is provided between the first crystal part 11 and at least a part of the second conductive layer 22. In this example, a portion of the first insulating member 31 is between the first crystal part 11 and the first conductive layer 21. With such an insulating member provided, the first conductive layer 21 is electrically connected to the first crystal part 11, and the second conductive layer 22 is electrically connected to the second crystal part 12. With such a configuration, the current obtained by one crystal pair 10P is appropriately taken out to the outside via the first conductive layer 21 and the second conductive layer 22.

As shown in FIG. 1A, in one example, the direction of the crystal orientation 11A of the first crystal part 11 includes a component opposite to the direction of the crystal orientation 12A of the second crystal part 12. For example, the direction of the crystal orientation 11A of the first crystal part 11 is along the second direction. For example, the direction of the crystal orientation 11A of the first crystal part 11 is along the direction from the second crystal part 12 toward the first crystal part 11. For example, the direction of the crystal orientation 12A of the second crystal part 12 is along the direction from the first crystal part 11 toward the second crystal part 12.

For example, the <000-1> direction of the first crystal part 11 is opposite to the <000-1> direction of the second crystal part 12.

As shown in FIG. 1B, for example, the (000-1) plane 11C of the first crystal part 11 faces the second crystal part 12. The (000-1) plane 12C of the second crystal part 12 faces the first crystal part 11. There is a gap 18 between the (000-1) plane 11C of the first crystal part 11 and the (000-1) plane 12C of the second crystal part 12. Since the surfaces facing each other are (000-1) surfaces, electrons are likely to be emitted. This results in higher efficiency.

The first crystal part 11 and the second crystal part 12 include, for example, a nitride semiconductor. For example, the first crystal part 11 includes at least one selected from the group consisting of B, Al, In and Ga, and nitrogen. For example, the second crystal part 12 includes at least one selected from the group consisting of B, Al, In and Ga, and nitrogen.

For example, the first crystal part 11 includes $Al_{x1}Ga_{1-x1}N$ ($0 \leq x1 \leq 1$). The second crystal part 12 includes $Al_{x2}Ga_{1-x2}N$ ($0 \leq x2 \leq 1$). The composition ratio x1 may be substantially the same as the composition ratio x2. The composition ratio x1 of Al in the first crystal part 11 is preferably, for example, not less than 0 and not more than 0.75. The composition ratio x1 of Al in the second crystal part 12 is preferably, for example, not less than 0 and not more than 0.75. Higher efficiency is likely to be obtained in such materials.

In one example according to the embodiment, the first crystal part 11 and the second crystal part 12 include at least one element selected from the group consisting of Si, Ge, Te and Sn. This element functions, for example, as an n-type impurity. For example, the first crystal part 11 and the second crystal part 12 include this n-type impurity (at least one element selected from the group consisting of Si, Ge, Te and Sn).

In one example, a concentration of n-type impurities in the first crystal part 11 and the second crystal part 12 is, for example, not less than $1 \times 10^{17}/cm^3$ and not more than $1 \times 10^{20}/cm^3$. For example, the electrical resistance in the first crystal part 11 and the second crystal part 12 can be lowered, and good power generation characteristics can be obtained.

In the embodiment, the first crystal part 11 and the second crystal part 12 may include at least one selected from the group consisting of ZnO and ZnMgO. In the embodiment, the first crystal part 11 and the second crystal part 12 may include at least one selected from the group of consisting $BaTiO_3$, $PbTiO_3$, $Pb(Zr_x, Ti_{1-x})O_3$, $KNbO_3$, $LiNbO_3$, $LiTaO_3$, $Na_xWO_3$, $Zn_2O_3$, $Ba_2NaNb_5O_5$, $Pb_2KNb_5O_{15}$ and $Li_2B_4O_7$. Polarization occurs in such materials. Polarization causes electrons to be emitted more efficiently.

The first insulating member 31 and the second insulating member 32 include, for example, at least one selected from the group consisting of $Al_2O_3$ and $SiO_2$. As a result, for example, low thermal conductivity can be obtained. For example, high thermal insulation can be obtained. The first conductive layer 21 and the second conductive layer 22 include at least one selected from the group consisting of Mo and W.

In the following, an example of a method for manufacturing a power generation element according to the embodiment will be described.

FIGS. 3A to 3C, 4A to 4C, 5A to 5C, and 6A to 6C are schematic cross-sectional views process order illustrating a method for manufacturing the power generation element according to the first embodiment.

As shown in FIG. 3A, a substrate 40s is prepared. The substrate 40s may be, for example, a silicon (110) substrate, a silicon (112) substrate, or the like.

As shown in FIG. 3B, a mask material 40M is formed on the substrate 40s. The mask material 40M includes, for example, $SiO_2$. The mask material 40M extends along the Y-axis direction. Multiple mask materials 40M are provided.

As shown in FIG. 3C, a portion of the substrate 40s is removed by using the mask material 40M. The removal may be performed by, for example, a treatment using a solution including KOH or the like. It is formed on the substrate 40s. A side surface 40f of the recess is, for example, a Si (111) surface. A silicon oxide film 41 or the like may be formed on the bottom of the recess.

As shown in FIG. 4A, a crystal to be the crystal member 10 is grown from the side surface 40f. The crystal is, for example, AlGaN. As a result, the first crystal part 11 and the second crystal part 12 are formed. The direction of the crystal orientation 11A of the first crystal part 11 is opposite to the direction of the crystal orientation 12A of the second crystal part 12.

As shown in FIG. 4B, the first insulating member 31 is formed. The first insulating member 31 includes, for example, $Al_2O_3$.

As shown in FIG. 4C, the first conductive layer 21 is formed. At least a portion of the first conductive layer 21 may be formed by bonding, for example.

Figure 5A:
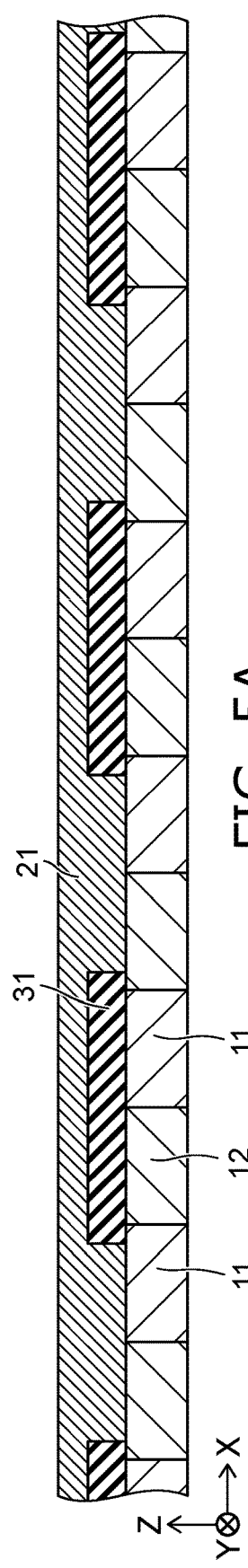
FIGS. 5A to 5C are schematic cross-sectional views in process order illustrating a method for manufacturing the power generation element according to the first embodiment.

As shown in FIG. 5A, the substrate 40s is removed. The removal is performed, for example, by at least one of grinding or dry etching.

Figure 5B:
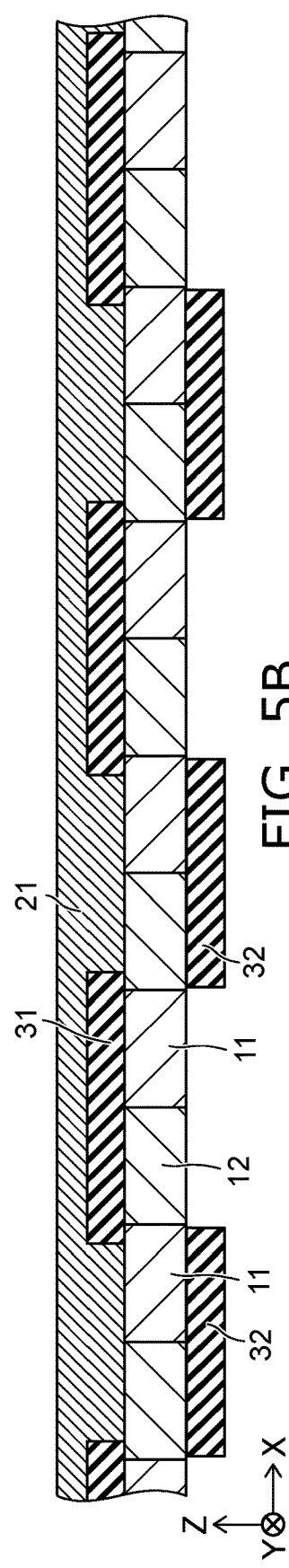

As shown in FIG. 5B, the second insulating member 32 is formed. The second insulating member 32 includes, for example, $Al_2O_3$.

Figure 5C:
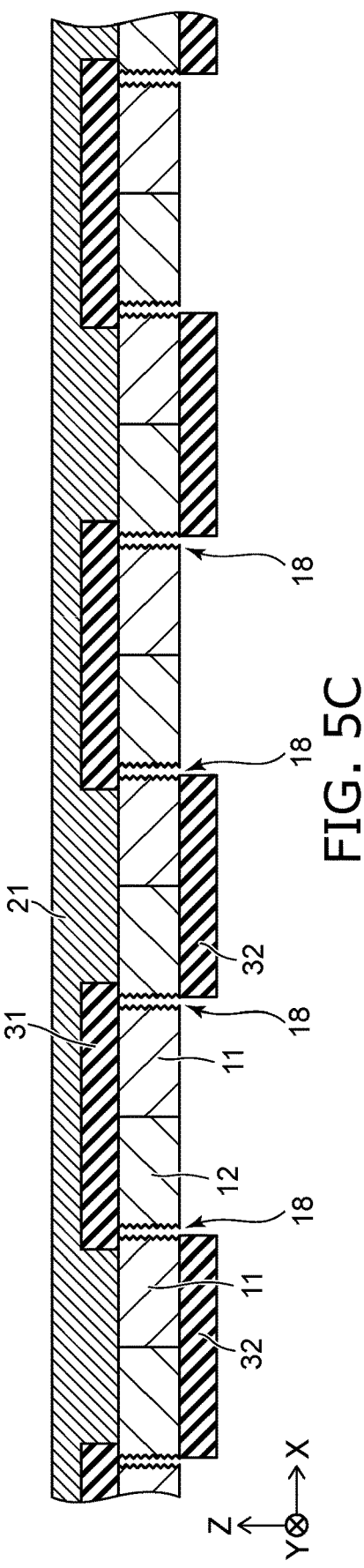

As shown in FIG. 5C, wet etching is performed. Wet etching includes, for example, etching with an alkaline solution such as KOH. As a result, the gap 18 is formed. Unevenness may be formed on the surfaces of the first crystal part 11 and the second crystal part 12 in the gap 18 portion.

Figure 6A:
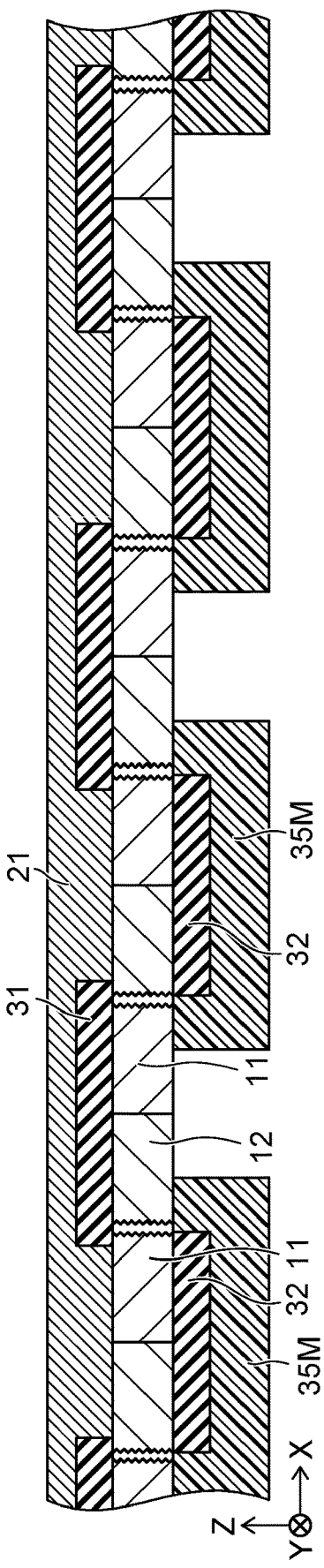
FIGS. 6A to 6C are schematic cross-sectional views in process order illustrating a method for manufacturing the power generation element according to the first embodiment.

As shown in FIG. 6A, a mask material 35M is formed. The mask material 35M covers the second insulating member 32. The mask material 35M exposes a portion of the first crystal part 11 and a portion of the second crystal part 12. The mask material 35M is, for example, a resist mask.

Figure 6B:
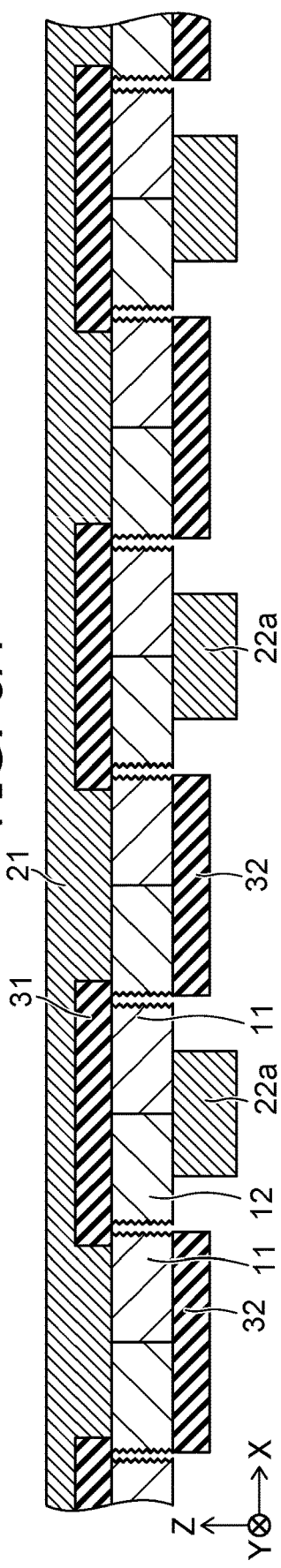

As shown in FIG. 6B, a conductive film 22a is formed on the portion not covered by the mask material 35M. The conductive film 22a is formed on the lower surfaces of the first crystal part 11 and the second crystal part 12. The conductive film 22a can be formed by, for example, vapor deposition. After forming the conductive film 22a, the mask material 35M is removed.

Figure 6C:
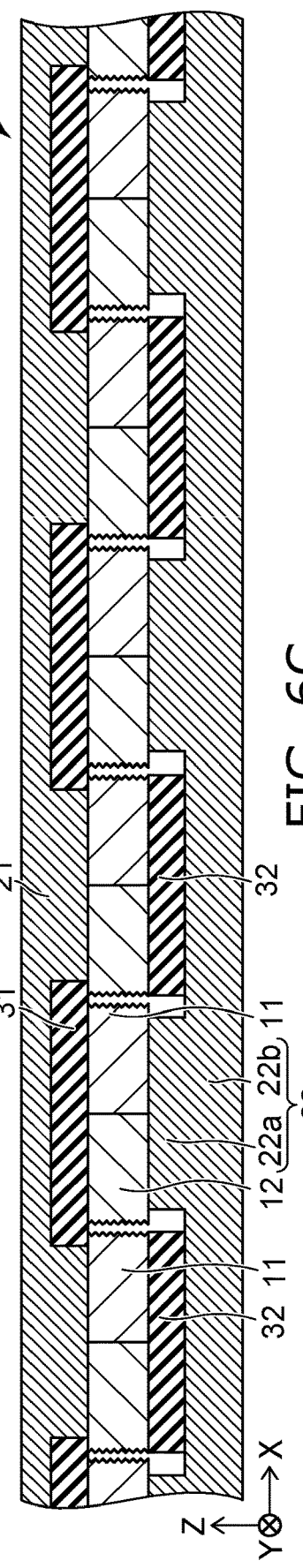

As shown in FIG. 6C, a conductive film 22b is formed. The conductive film 22a and the conductive film 22b provide the second conductive layer 22.

After introducing Cs or the like into the gap 18, it may be sealed by metal bonding with the conductive film 22b or the like. By such a method, for example, the power generation element 110 can be obtained.

FIGS. 7A to 7C, 8A to 8C, 9A to 9C, and 10A to 10C are schematic cross-sectional views in process order illustrating a method for manufacturing method a power generation element according to the first embodiment.

As shown in FIGS. 7A to 7C, the mask material 40M is formed on the substrate 40s, and a portion of the substrate 40s is removed by using the mask material 40M. A recess of the substrate 40s is formed. The side surface 40f of the recess is, for example, a Si (111) surface.

As shown in FIG. 8A, a crystal to be the crystal member 10 is grown from the side surface 40f. The crystal is, for example, AlGaN. As a result, the first crystal part 11 and the second crystal part 12 are formed. The direction of the crystal orientation 11A of the first crystal part 11 is opposite to the direction of the crystal orientation 12A of the second crystal part 12. As shown in FIG. 8A, another crystal region 13 may be formed. The crystal orientation in the other crystal region 13 is different from the crystal orientation of the first crystal part 11 and the second crystal part 12. As in the example of FIG. 8A, a crystal part 17 may be formed on the mask material 40M.

As shown in FIG. 8B, the surface is flattened by, for example, HF treatment.

As shown in FIG. 8C, the first insulating member 31 is formed. The first insulating member 31 includes, for example, $Al_2O_3$.

Figure 9A:
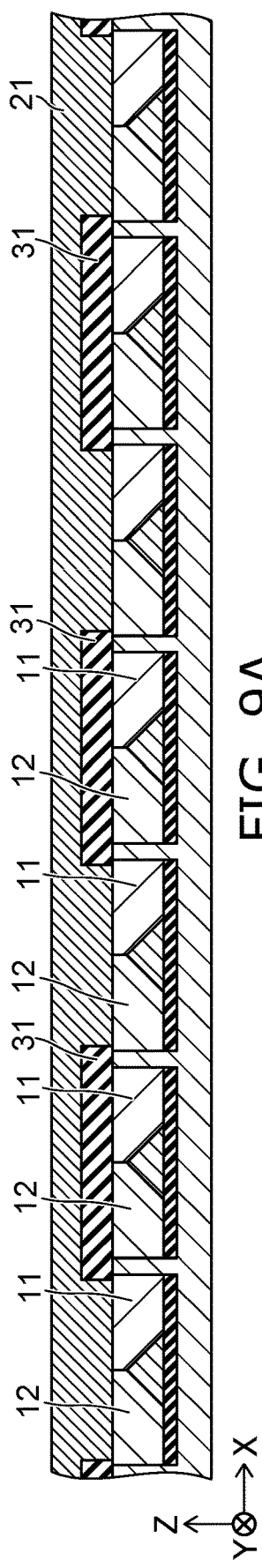
FIGS. 9A to 9C are schematic cross-sectional views in process order illustrating a method for manufacturing the power generation element according to the first embodiment.

As shown in FIG. 9A, the first conductive layer 21 is formed. The first conductive layer 21 can be formed by, for example, bonding.

Figure 9B:
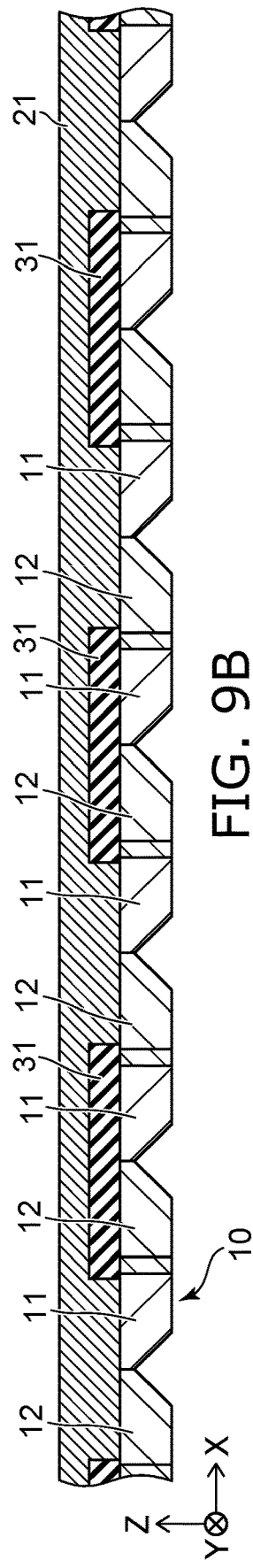

As shown in FIG. 9B, the substrate 40s is removed. The removal is performed, for example, by at least one of grinding or dry etching. In this process, the other crystal region 13 is also removed. As a result, a recess is formed in the crystal member 10.

Figure 9C:
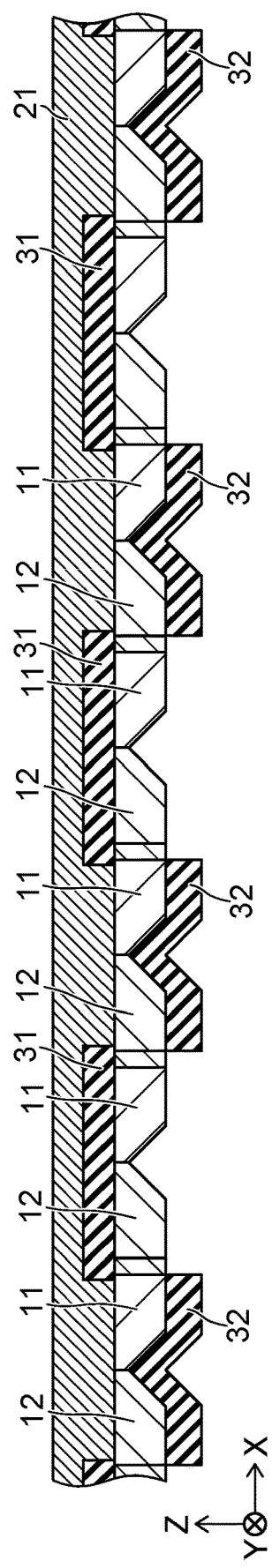

As shown in FIG. 9C, the second insulating member 32 is formed. The second insulating member 32 includes, for example, A1203. The second insulating member 32 is also formed in the recess of the crystal member 10.

As shown in FIG. 10A, the gap 18 is formed by performing dry etching or wet etching. Unevenness may be formed on the surfaces of the first crystal part 11 and the second crystal part 12 in the gap 18 portion.

As shown in FIG. 10B, the mask material 35M (see FIG. 6A) is used to form the conductive film 22a in the portion not covered by the mask material 35M, and then the mask material 35M is removed.

As shown in FIG. 10C, the conductive film 22b is formed. The conductive film 22a and the conductive film 22b provide the second conductive layer 22. After that, Cs or the like is introduced into the gap 18 and sealed by metal bonding or the like. By such a method, for example, a power generation element 111 can be obtained.

FIGS. 11A to 11C, 12A to 12C, 13A to 13C, 14A to 14C, and FIG. 15 are schematic cross-sectional views in process order illustrating a method for manufacturing a power generation element according to the first embodiment.

As shown in FIGS. 11A to 11C, the mask material 40M is formed on the substrate 40s, and a portion of the substrate 40s is removed by using the mask material 40M. A recess of the substrate 40s is formed. The side surface 40f of the recess is, for example, a Si (111) surface.

Figure 12A:
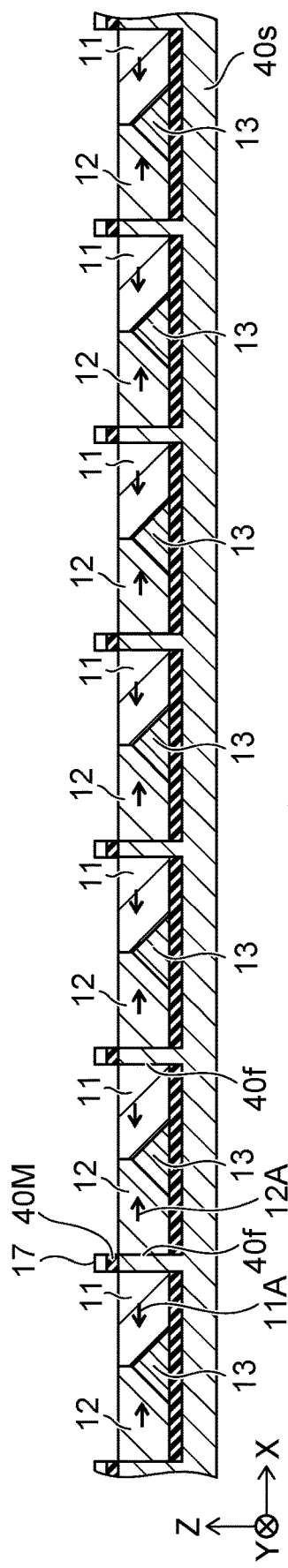
FIGS. 12A to 12C are schematic cross-sectional views in process order illustrating a method for manufacturing a power generation element according to the first embodiment.
Figure 12B:
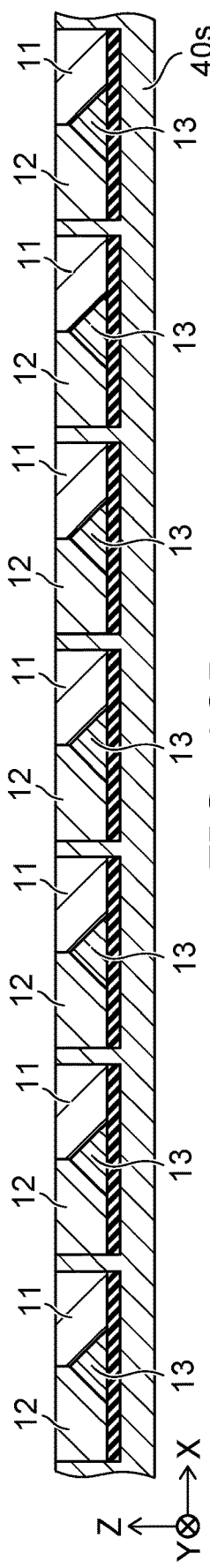
Figure 12C:
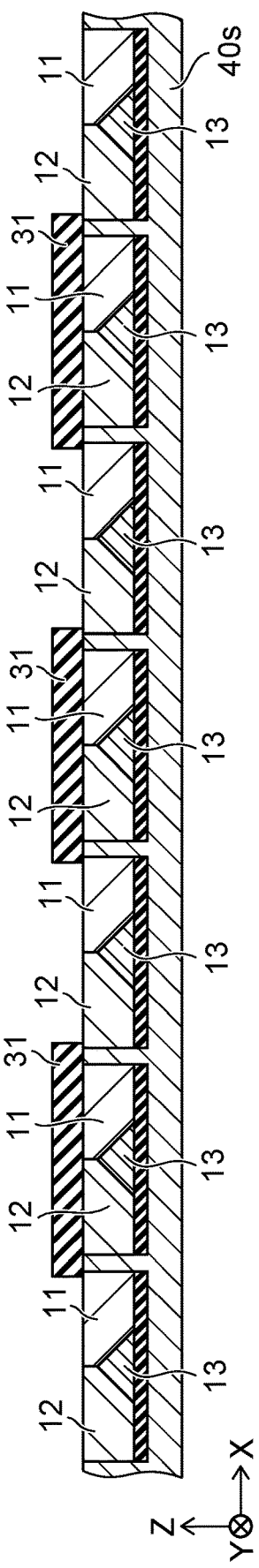

As shown in FIGS. 12A to 12C, a crystal (for example, AlGaN) to be the crystal member 10 is grown from the side surface 40f, the surface is flattened, and the first insulating member 31 is formed. As shown in FIG. 12A, in this example, the other crystal region 13 is formed.

Figure 13A:
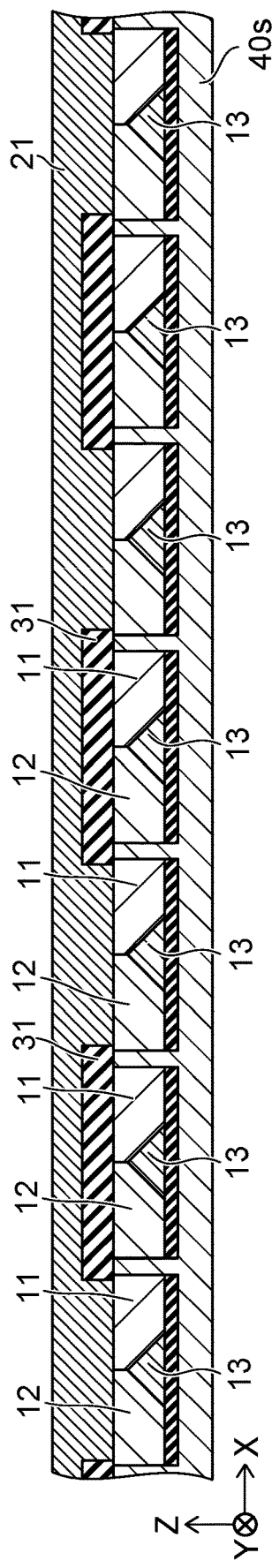
FIGS. 13A to 13C are schematic cross-sectional views in process order illustrating a method for manufacturing the power generation element according to the first embodiment.
Figure 13B:
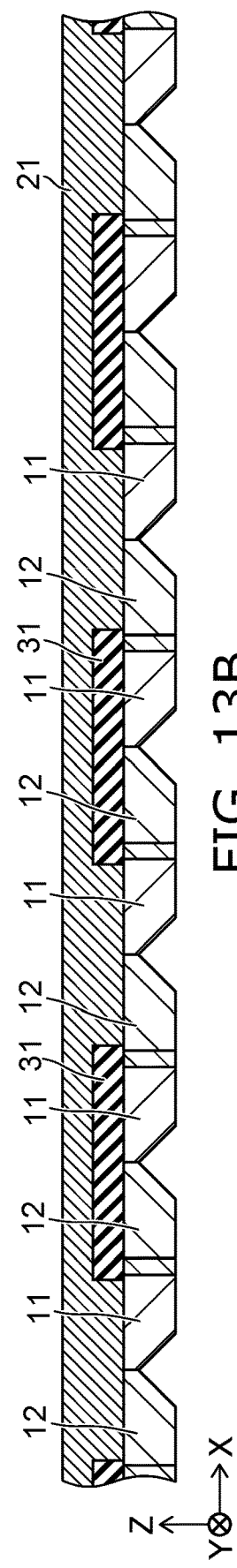
Figure 13C:
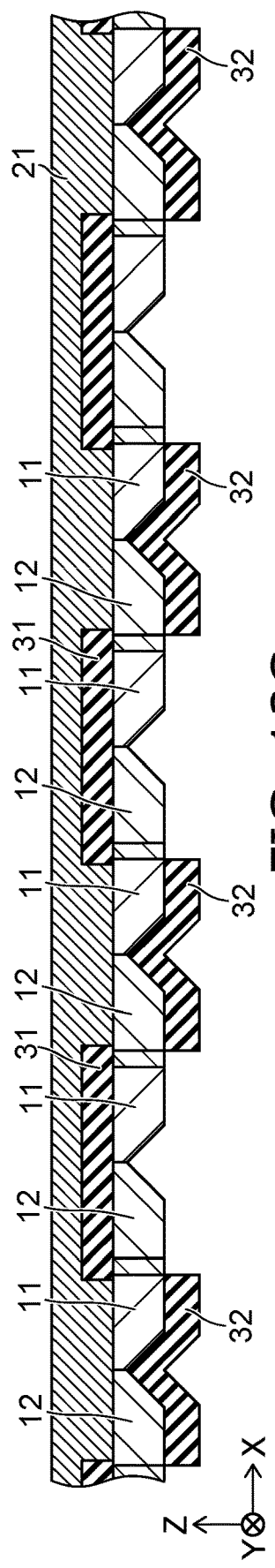

As shown in FIGS. 13A to 13C, the first conductive layer 21 is formed, the substrate 40s and the other crystal region 13 are removed, and the second insulating member 32 is formed.

Figure 14A:
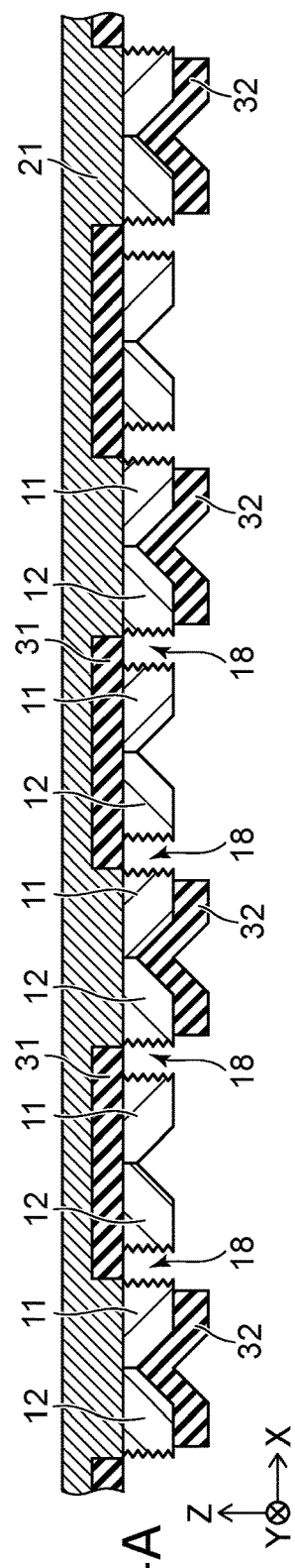
FIGS. 14A to 14C are schematic cross-sectional views in process order illustrating a method for manufacturing the power generation element according to the first embodiment.

As shown in FIG. 14A, the gap 18 is formed by performing dry etching or wet etching. Unevenness may be formed on the surfaces of the first crystal part 11 and the second crystal part 12 in the gap 18 portion.

Figure 14B:
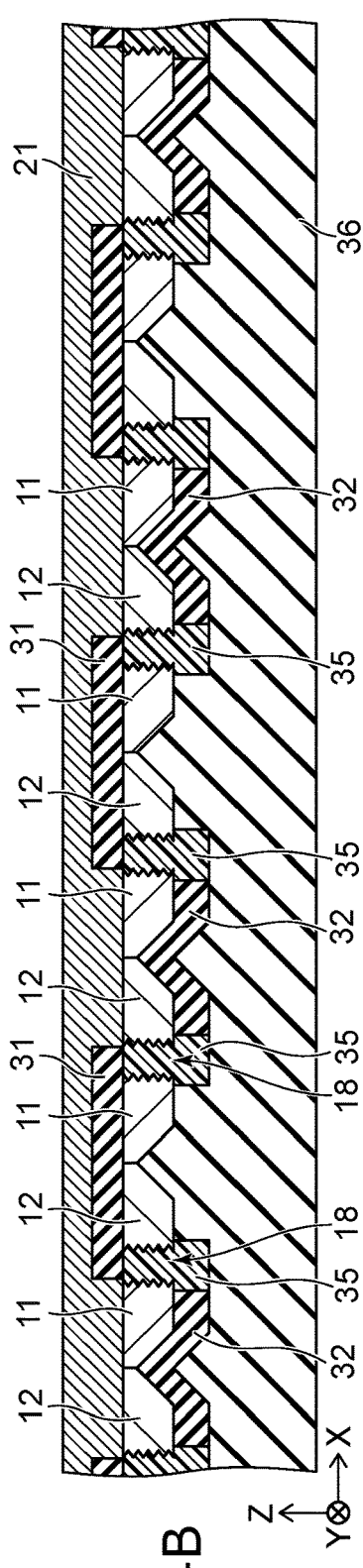

As shown in FIG. 14B, a resist mask 35 is embedded in the gap 18. Further, a mask material 36 is formed. The mask material 36 includes, for example, $SiO_2$.

Figure 14C:
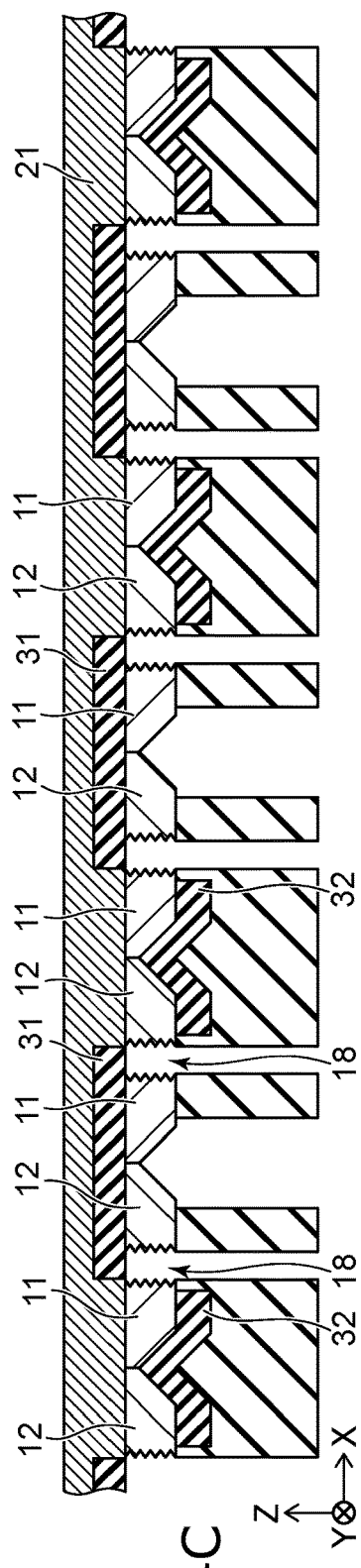

As shown in FIG. 14C, the region of the mask material 36 that overlaps the resist mask 35 and the region of the mask material 36 where the second insulating member 32 is not provided are removed. The removal is performed, for example, by etching with another mask material. Removal of the resist mask 35 exposes the gap 18. A through hole is formed. Further, the lower surfaces of the portion of the first crystal part 11 and the portion of the second crystal part 12 to which the second insulating member 32 is not provided are exposed.

Figure 15:
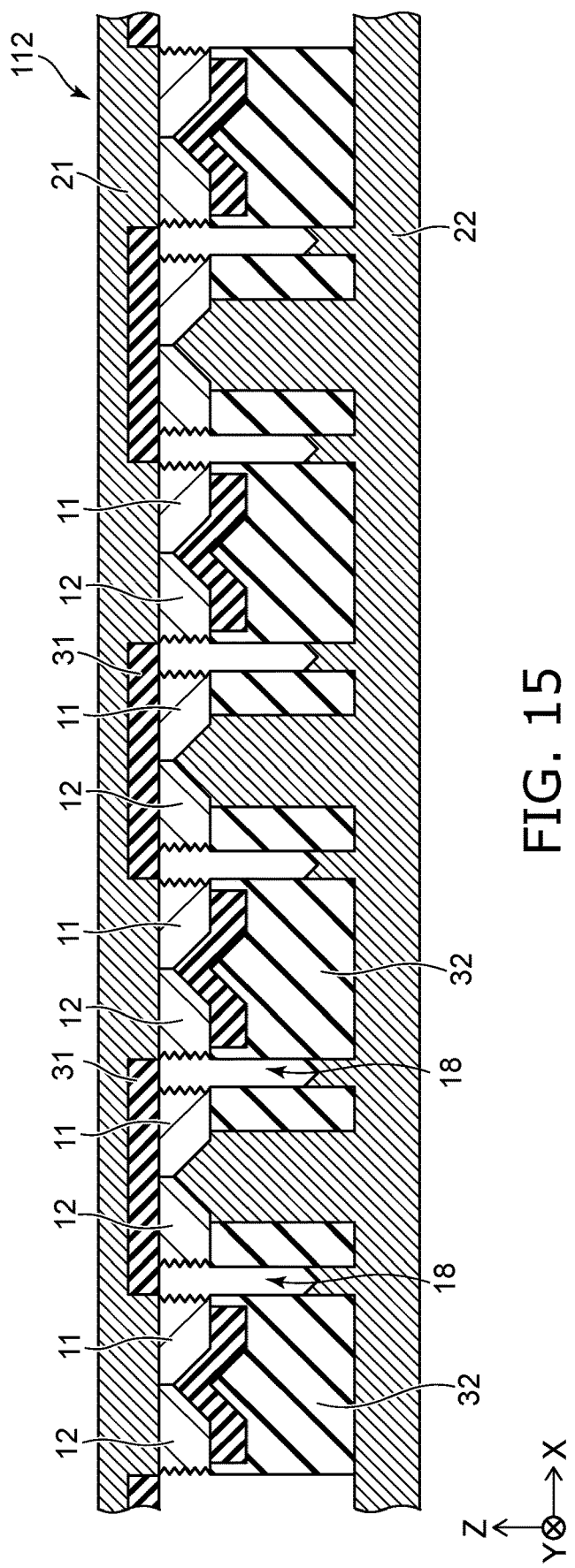
FIG. 15 is a schematic cross-sectional view in process order illustrating a method for manufacturing the power generation element according to the first embodiment.

As shown in FIG. 15, for example, the second conductive layer 22 is formed by vapor deposition or the like. The material to be the second conductive layer 22 closes the opening of the through hole. Before forming the second conductive layer 22, Cs or the like may be introduced into the gap 18. By such a method, for example, a power generation element 112 can be obtained.

Second Embodiment

Figure 16:
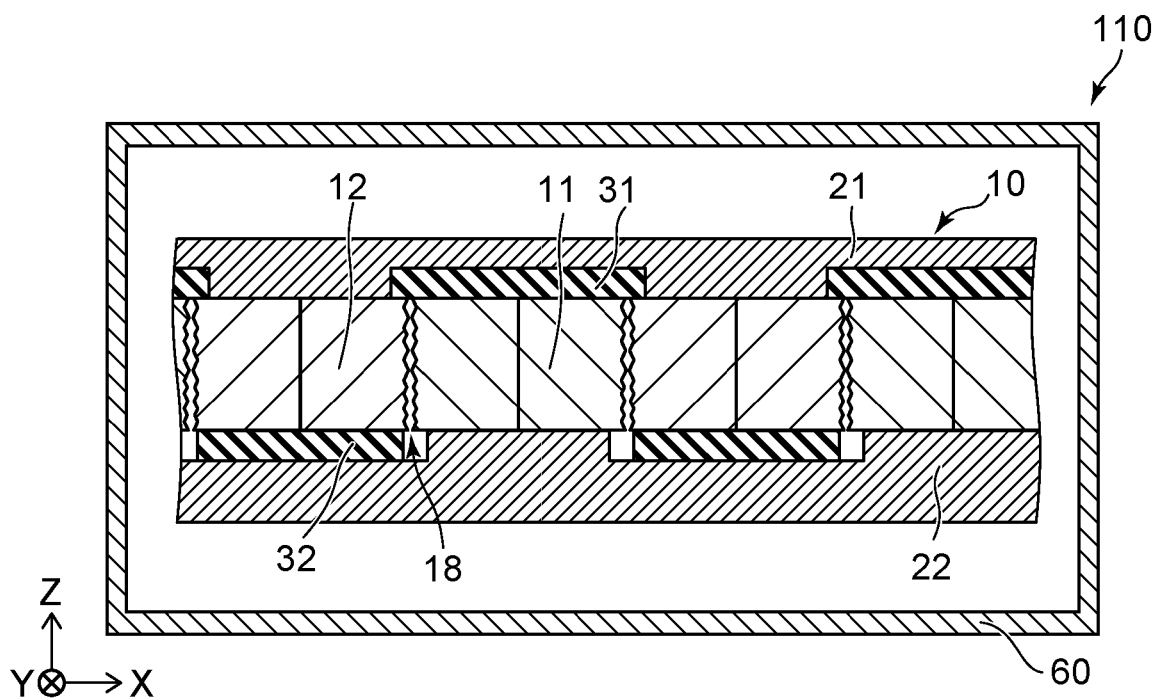
FIG. 16 is a schematic cross-sectional view illustrating a power generation element according to a second embodiment.

FIG. 16 is a schematic cross-sectional view illustrating a power generation element according to a second embodiment.

As shown in FIG. 16, the power generation element 110 may include a container 60. The first conductive layer 21, the second conductive layer 22, and the crystal member 10 are provided in the container 60. The pressure inside the container 60 is lower than the atmospheric pressure. For example, the void 18 is in a reduced pressure state. The electrons emitted from one crystal part efficiently reach the other crystal part.

In the following, an example of application of the power generation element will be described.

Figure 17A:
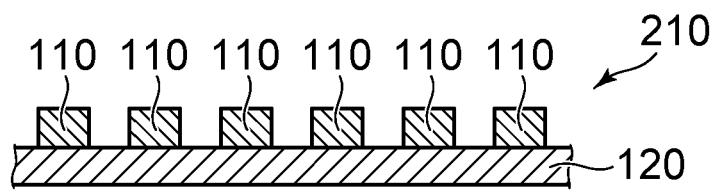
FIGS. 17A and 17B are schematic cross-sectional views illustrating a power generation module and a power generation device according to the embodiment.
Figure 17B:
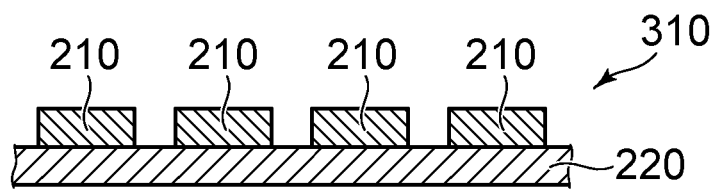

FIGS. 17A and 17B are schematic cross-sectional views illustrating a power generation module and a power generation device according to the embodiment.

As shown in FIG. 17A, a power generation module 210 according to the embodiment includes the power generation element (for example, the power generation element 110) according to the second embodiment. In this example, multiple power generation elements 110 are arranged on a substrate 120.

As shown in FIG. 17B, a power generation device 310 according to the embodiment includes the power generation module 210 described above. Multiple power generation modules 210 may be provided. In this example, the multiple power generation modules 210 are arranged on a substrate 220.

Figure 18A:
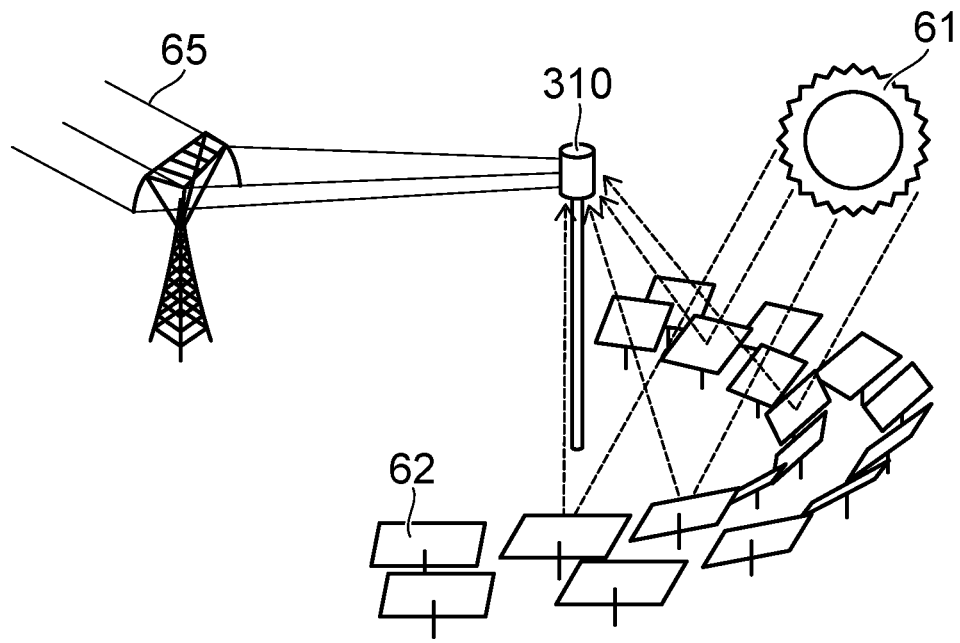
FIGS. 18A and 18B are schematic views illustrating the power generation device and a power generation system according to the embodiment.
Figure 18B:
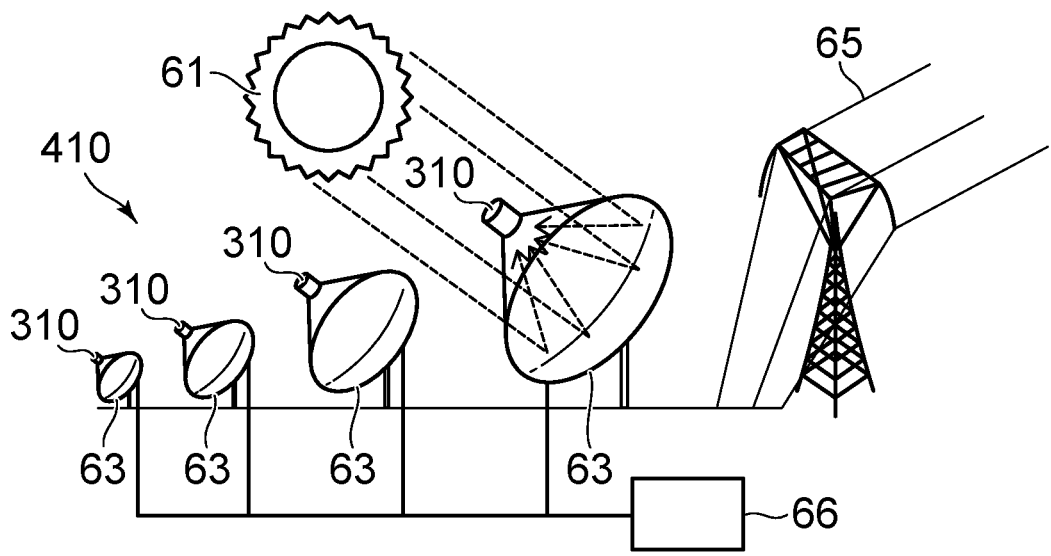

FIGS. 18A and 18B are schematic views showing the power generation device and a power generation system according to the embodiment.

As shown in FIGS. 18A and 18B, the power generation device 310 according to the embodiment (that is, the power generation element 110 according to the embodiment) can be applied to solar thermal power generation.

As shown in FIG. 18A, for example, the light from the sun 61 is reflected by a heliostat 62 and incident on the power generation device 310 (power generation element 110 or power generation module 210). The light raises the temperature of the power generation element. Heat is converted into a current. The current is transmitted by the electric line 65 or the like.

As shown in FIG. 18B, for example, the light from the sun 61 is collected by a condensing mirror 63 and incident on the power generation device 310 (power generation element 110 or power generation module 210). The heat from the light is converted into a current. The current is transmitted by the electric line 65 or the like.

For example, a power generation system 410 includes the power generation device 310. In this example, multiple power generation devices 310 are provided. In this example, the power generation system 410 includes power generation devices 310 and a drive device 66. The drive device 66 causes the power generation device 310 to track the movement of the sun 61. Efficient power generation can be carried out by tracking. The power generation system 410 is, for example, a solar power generation system. The power generation system 410 is one example of a power generation equipment.

By using the power generation element according to the embodiment (for example, the power generation element 110), high-efficiency power generation can be performed.

According to the embodiment, a power generation element and a power generation system which are possible to improve efficiency can be provided.
0080

In the specification, "a state of electrically connected" includes a state in which multiple conductors physically contact and current flows between the multiple conductors. "A state of electrically connected" includes a state in which another conductor is inserted between the multiple conductors and current flows between the multiple conductors.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as conductive layers, crystal members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements, and power generation systems practicable by an appropriate design modification by one skilled in the art based on the power generation elements, the power generation systems described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
   a first conductive layer;
   a second conductive layer, a direction from the second conductive layer toward the first conductive layer being along a first direction;
   a crystal member provided between the first conductive layer and the second conductive layer, the crystal member including a first crystal pair and a second crystal pair, each of the first crystal pair and the second crystal pair including a first crystal part and a second crystal part, a second direction from the first crystal part toward the second crystal part crossing the first direction;

a first insulating member; and a second insulating member, wherein the first crystal part and the second crystal part of the first crystal pair directly contact each other, the first crystal part of the first crystal pair being provided between the second crystal part of the first crystal pair and the first crystal part of the second crystal pair, the second crystal part of the second crystal pair being provided between the first crystal part of the first crystal pair and the first crystal part of the second crystal pair, a gap being provided between the first crystal part of the first crystal pair and the second crystal part of the second crystal pair in the second direction, the first conductive layer being electrically connected to the second crystal part of the first crystal pair and the first crystal part of the first crystal pair, the second conductive layer being electrically connected to the second crystal part of the second crystal pair and the first crystal part of the second crystal pair, the first insulating member being provided between the second crystal part of the second crystal pair and at least a portion of the first conductive layer in the first direction, and between the first crystal part of the second crystal pair and the at least the portion of the first conductive layer in the first direction, the second insulating member being provided between the first crystal part of the first crystal pair and at least a portion of the second conductive layer in the first direction, and between the second crystal part of the first crystal pair and at least the portion of the second conductive layer.

2. The element according to claim 1, wherein the first crystal part of the first crystal pair has a first thickness along the first direction, and a first width along the second direction, the first thickness is larger than the first width, the second crystal part of the second crystal pair has a second thickness along the first direction, and a second width along the second direction, and the second thickness is larger than the second width.

3. The element according to claim 2, wherein the first crystal part of the first crystal pair has a first length along a third direction crossing a plane including the first direction and the second direction, the first length is larger than the first thickness, the second crystal part of the second crystal pair has a second length along the third direction, and the second length is larger than the second thickness.

4. The element according to claim 2, wherein a length along the second direction of the gap is smaller than the first width and smaller than the second width.

5. The element according to claim 4, wherein the length along the second direction of the gap is not more than 10 μm.

6. The element according to claim 1, wherein a direction of a crystal orientation of the first crystal part of the first crystal pair is opposite to a direction of a crystal orientation of the second crystal part of the second crystal pair.

7. The element according to claim 6, wherein the direction of the crystal orientation of the first crystal part of the first crystal pair is along the second direction.

8. The element according to claim 1, wherein a <000-1> crystal direction of the first crystal part of the first crystal pair is opposite to a <000-1> crystal direction of the second crystal part of the second crystal pair.

9. The element according to claim 1, wherein a (000-1) plane of the first crystal part of the first crystal pair faces the second crystal part of the second crystal pair, a (000-1) plane of the second crystal part of the second crystal pair faces the first crystal part of the first crystal pair, and the gap is between the (000-1) plane of the first crystal part of the first crystal pair and the (000-1) plane of the second crystal part of the second crystal pair.

10. The element according to claim 1, wherein the first crystal part of the first crystal pair includes at least one selected from the group consisting of B, Al, In and Ga, and nitrogen, and the second crystal part of the second crystal pair includes at least one selected from the group consisting of B, Al, In and Ga, and nitrogen.

11. The element according to claim 1, wherein the first crystal part of the first crystal pair includes $Al_{x1}Ga_{1-x1}N$ ($0 \leq x1 \leq 1$), and the second crystal part of the second crystal pair includes $Al_{x2}Ga_{1-x2}N$ ($0 \leq x2 \leq 1$).

12. The element according to claim 10, wherein the first crystal part of the first crystal pair includes at least one selected from the group consisting of Si, Ge, Te and Sn, and the second crystal part of the second crystal pair includes at least one selected from the group consisting of Si, Ge, Te and Sn.

13. The element according to claim 1, wherein the first crystal part of the first crystal pair includes at least one selected from the group consisting of ZnO and ZnMgO, and the second crystal part of the second crystal pair includes at least one selected from the group consisting of ZnO and ZnMgO.

14. The element according to claim 1, wherein the first crystal part of the first crystal pair includes a first portion, and a first surface layer provided on a surface of the first portion, and the first surface layer includes at least one selected from the group consisting of Li, Na, K, Rb, Cs, Fr, Be, Mg, Ca, Sr, Ba and Ra.

15. The element according to claim 1, wherein the crystal member includes a plurality of crystal pairs including the first crystal pair and the second crystal pair, and the plurality of crystal pairs are arranged along the second direction.

16. The element according to claim 15, wherein a second crystal part of one of the plurality of crystal pairs is between a first crystal part of the one of the plurality of crystal pairs and a first crystal part of an other one of the plurality of crystal pairs.

17. The element according to claim 16, wherein at least a portion of the second crystal part of the one of the plurality of crystal pairs contacts at least a portion of the first crystal part of the other one of the plurality of crystal pairs.

18. The element according to claim 1, wherein
in a case where a temperature of the first conductive layer is higher than a temperature of the second conductive layer,
electrons are emitted from the first crystal part of the first crystal pair toward the second crystal part of the second crystal pair, and
in a case where the temperature of the second conductive layer is higher than the temperature of the first conductive layer,
electrons are emitted from the second crystal part of the second crystal pair toward the first crystal part of the first crystal pair.

19. A power generation system, comprising:
the power generation element according to claim 1.

* * * * *